(12) United States Patent
Hsia et al.

(10) Patent No.: US 8,993,447 B2
(45) Date of Patent: Mar. 31, 2015

(54) LED DEVICE WITH IMPROVED THERMAL PERFORMANCE

(71) Applicant: TSMC Solid State Lighting Ltd., HsinChu (TW)

(72) Inventors: Hsing-Kuo Hsia, Jhubei (TW); Chih-Kuang Yu, Chiayi (TW); Hung-Yi Kuo, Taipei (TW); Chyi Shyuan Chern, Taipei (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 0 days.

(21) Appl. No.: 13/858,785

(22) Filed: Apr. 8, 2013

(65) Prior Publication Data

US 2013/0230935 A1    Sep. 5, 2013

Related U.S. Application Data

(62) Division of application No. 12/944,895, filed on Nov. 12, 2010, now Pat. No. 8,415,684.

(51) Int. Cl.
*H01L 21/311* (2006.01)
*H01L 33/64* (2010.01)

(52) U.S. Cl.
CPC ............ *H01L 33/64* (2013.01); *H01L 33/642* (2013.01); *H01L 33/641* (2013.01)
USPC .... 438/700; 438/106; 438/141; 257/E21.006; 257/E21.054; 257/E21.085; 257/E21.126; 257/E21.127; 257/E21.352

(58) Field of Classification Search
USPC ............ 438/700, 91, 99, 106, 141, 637, 706, 438/708; 257/E21.006, E21.054, E21.085, 257/E21.126, E21.127, E21.352
See application file for complete search history.

(56) References Cited

U.S. PATENT DOCUMENTS

| | | | | |
|---|---|---|---|---|
| 6,784,530 | B2 * | 8/2004 | Sugaya et al. | 257/686 |
| 7,018,866 | B2 * | 3/2006 | Sugaya et al. | 438/108 |
| 7,911,068 | B2 * | 3/2011 | Meyer et al. | 257/786 |
| 8,415,684 | B2 * | 4/2013 | Hsia et al. | 257/79 |

* cited by examiner

*Primary Examiner* — David Nhu

(74) *Attorney, Agent, or Firm* — Haynes and Boone, LLP

(57) ABSTRACT

An apparatus includes a wafer with a number of openings therein. For each opening, an LED device is coupled to a conductive carrier and the wafer in a manner so that each of the coupled LED device and a portion of the conductive carrier at least partially fill the opening. A method of fabricating an LED device includes forming a number of openings in a wafer. The method also includes coupling light-emitting diode (LED) devices to conductive carriers. The LED devices with conductive carriers at least partially fill each of the openings.

20 Claims, 8 Drawing Sheets

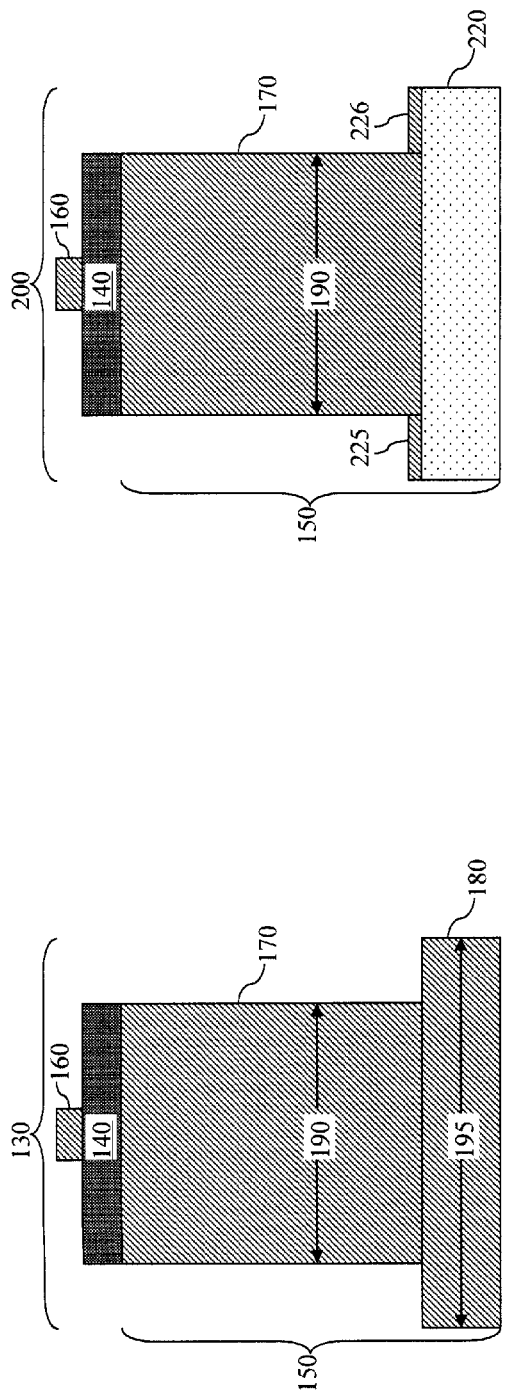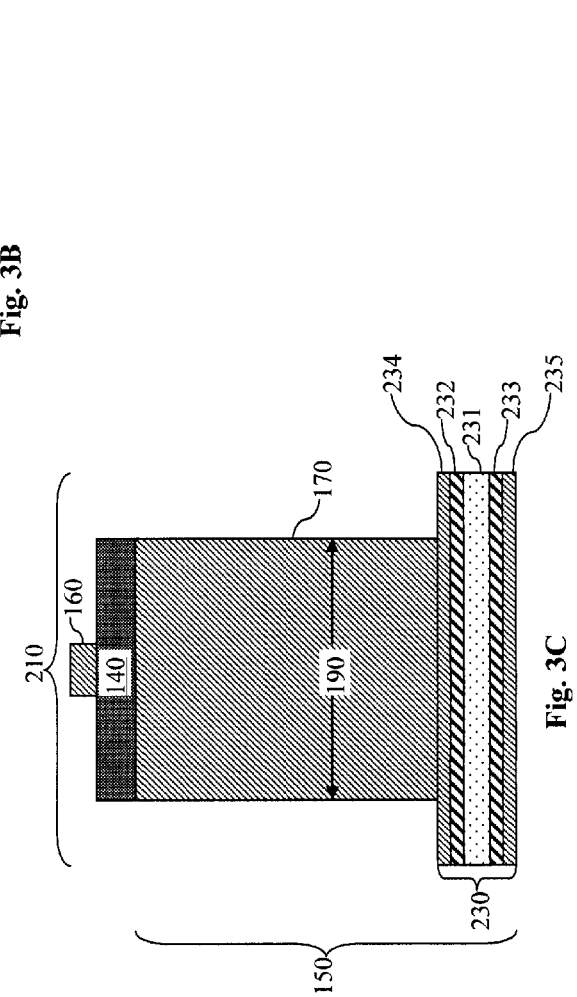
Fig. 3A  Fig. 3B  Fig. 3C

US 8,993,447 B2

LED DEVICE WITH IMPROVED THERMAL PERFORMANCE

PRIORITY DATA

This application is a divisional application of U.S. patent application Ser. No. 12/944,895, filed on Nov. 12, 2010, entitled "LED DEVICE WITH IMPROVED THERMAL PERFORMANCE", now U.S. Pat. No. 8,415,684, issued on Apr. 9, 2013, the disclosure of which is hereby incorporated by reference in its entirety.

BACKGROUND

The semiconductor integrated circuit (IC) industry has experienced rapid growth in recent years. Technological advances in IC materials and design have produced various types of ICs that serve different purposes. One type of these ICs includes photonic devices, such as light-emitting diode (LED) devices. LED devices emit light through movement of electrons in a semiconductor material when a voltage is applied. LED devices have increasingly gained popularity due to favorable characteristics such as small device size, long life time, efficient energy consumption, and good durability and reliability.

LED devices generate thermal energy such as heat during its operation. LED devices fabricated using existing methods may have relatively inefficient thermal dissipation. Therefore, while existing methods of fabricating the LED devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A-3C are diagrammatic fragmentary cross-sectional side views of different embodiments of a structure that contains an LED device in accordance with various aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
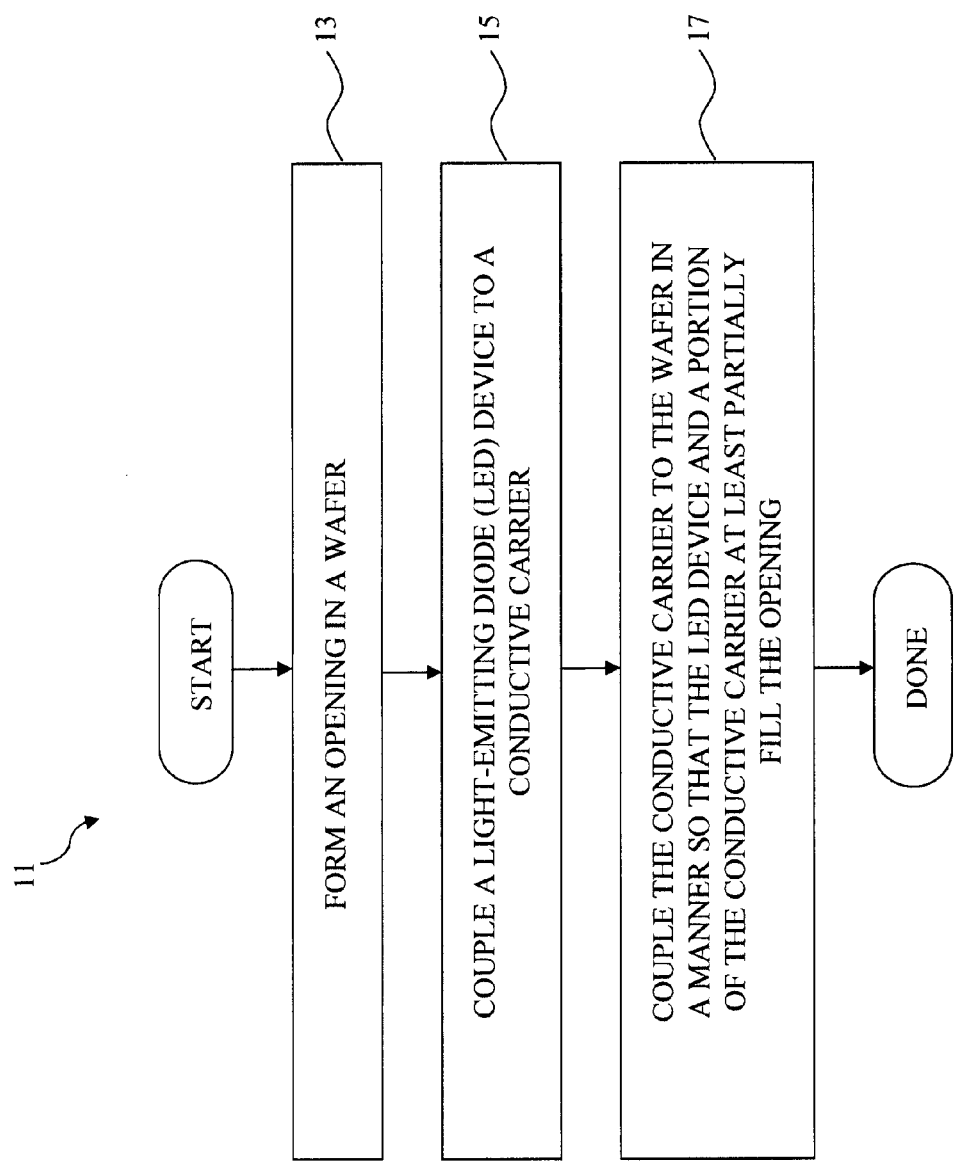
FIG. 1 is a flowchart illustrating a method for fabricating a LED device according to various aspects of the present disclosure.

Illustrated in FIG. 1 is a flowchart of a method 11 according to various aspects of the present disclosure. The method 11 begins with block 13 in which openings are formed in a wafer. The wafer may include a substrate, and the openings may be formed using a dry etching process. The method 11 continues with block 15 in which light-emitting diode (LED) devices are coupled to conductive carriers. The method 11 continues with block 17 in which the conductive carriers are coupled to the wafer in manner so that the LED devices and portions of the conductive carriers at least partially fill the openings.

FIGS. 2 to 8 are diagrammatic fragmentary cross-sectional side views of various portions of a semiconductor wafer at various fabrication stages according to embodiments of the method 11 of FIG. 1. The word "wafer" may be used herein to refer to the substrate of the wafer or may be used to refer to the substrate as well as the various components formed on the substrate. The processes discussed below pertain to wafer-level processing of LED packages, meaning they are processes performed to the packaged wafer before the wafer is sliced and diced into individual LED packages. It is understood that FIGS. 2 to 8 have been simplified for a better understanding of the inventive concepts of the present disclosure.

Figure 2:
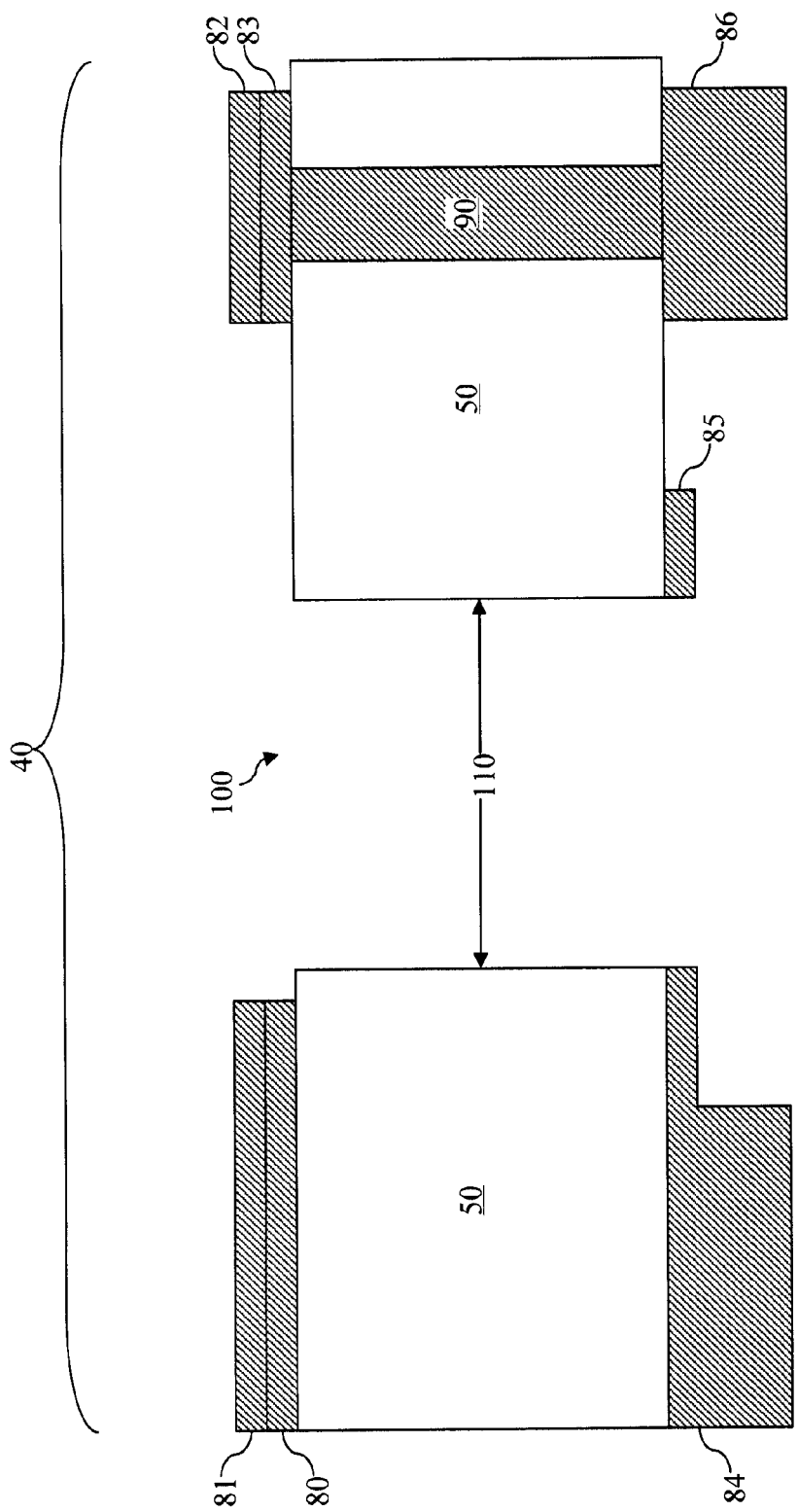
FIG. 2 is a diagrammatic fragmentary cross-sectional side view of a portion of a wafer having an opening therein in accordance with various aspects of the present disclosure.

Referring to FIG. 2, a portion of a wafer 40 is illustrated. The wafer 40 includes a substrate 50. The substrate 50 is a non-metal material. In one embodiment, the substrate 50 contains a ceramic material. In other embodiments, the substrate 50 may contain a silicon material, a plastic material, or an organic material. The substrate 50 may contain no active circuitry and may be used to establish interconnections.

The wafer 40 also includes conductive elements 80-86 (may also be referred to as conductive layers or conductive components). The conductive elements 80-83 are formed over one side of the substrate 50. For ease of reference, this side of the substrate may be referred to as a top side. The conductive elements 84-86 are formed over a side of the substrate 50 that is opposite the top side. For ease of reference, this opposite side may be referred to as a bottom side.

In an embodiment, the conductive elements 80-86 include metal pads, which are both thermally and electrically conductive. For example, the conductive element 83 may be a metal wire-bonding pad, the conductive elements 81 and 82 may be a metal reflector pad that can reflect light, and the conductive elements 84 and 85 may include metal soldering pads. In some embodiments, the conductive elements 80 and 81 may be integrated into a single conductive element, and the conductive elements 82 and 83 may be integrated into a single conductive element.

The wafer 40 also includes a through-silicon via (TSV) 90. The TSV 90 includes a conductive material such as a metal material. The TSV 90 extends through the substrate 50. In an embodiment, the TSV 90 is solid. In another embodiment, the TSV 90 may be hollow. The TSV 90 allows transmission of electrical signals from the top side of the substrate 60 to the bottom side, and vice versa. Although only one TSV 90 is illustrated, it is understood that a plurality of TSVs may be formed in the wafer 40.

A plurality of openings (also referred to as through-holes) is formed in the wafer 40. For the sake of simplicity, only one such opening is shown in FIG. 2 as opening 100. The opening 100 is formed by a suitable process such as a dry etching process or a laser process. The opening 100 has a lateral dimension (also referred to as diameter/width) 110. In an embodiment, the lateral dimension 110 is in a range from about 0.1 millimeter (mm) to about 30 mm, generally from about 0.3 mm to about 15 mm. In the embodiment illustrated in FIG. 2, the size of the lateral dimension 110 remains substantially the same throughout the substrate 50. In other words, the portion of the opening 100 in the substrate 50 does not vary in size.

The openings (such as the opening 100) of the wafer 40 are to be filled or mated with a plurality of structures that each contain an LED device. Such structure may be referred to as an LED-containing structure or LED carriers. Several embodiments of such LED-containing structure are illustrated in FIGS. 3A, 3B, and 3B and are discussed in more detail below.

Referring now to FIG. 3A, a portion of one of the LED-containing structures is illustrated as structure 130. The LED-containing structure 130 includes an LED device 140, a carrier 150, and a contact pad 160. In an embodiment, the LED device 140 is an LED die. The LED die may include oppositely doped semiconductor layers that form a P/N junction. For example, one of these oppositely doped semiconductor layers may be a layer of gallium nitride (GaN) doped with a P-type dopant such as boron (B), and the oppositely doped layer may be a layer of gallium nitride doped with an N-type dopant such as arsenic (As) or phosphorous (P).

The LED die may include a multiple-quantum well (MWQ) layer that is disposed between the oppositely doped semiconductor layers. The MQW layer has alternating (or periodic) layers of gallium nitride and indium gallium nitride (InGaN). For example, in one embodiment, the MQW layer may have ten (or any other suitable number) layers of gallium nitride and ten (or any other suitable number) layers of indium gallium nitride, where an indium gallium nitride layer is formed on a gallium nitride layer, and another gallium nitride layer is formed on the indium gallium nitride layer, so on and so forth. For the sake of simplicity, the oppositely doped P-type and N-type layers and the MQW layer of the LED device 140 are not specifically illustrated.

When an electrical voltage (or electrical charge) is applied to the LED device 140, electrical current flows through the MQW layer. As a result, the MQW layer emits radiation such as light in an observable spectrum. The color of the light emitted by the MQW layer corresponds to the wavelength of the light. The wavelength of the light (and hence the color of the light) may be tuned by varying the composition and structure of the materials that make up the MQW layer.

The LED device 140 is fabricated using a growth substrate such as a sapphire substrate (not illustrated herein). The LED device 140 is then coupled to the carrier 150 (also referred to as a carrier structure), and the growth substrate is removed. The carrier 150 includes a core portion 170 (also referred to as a core component) and a base portion 180 (also referred to as a base component). The core portion 170 includes a thermally and electrically conductive material and is directly coupled to the LED device 140. The core portion 170 has a lateral dimension 190 that is less than the lateral dimension 110 of the opening 100 (shown in FIG. 2). It is also understood that the lateral dimension 190 is substantially equal to the lateral dimension of the LED device 140.

The base portion 180 includes a thermally and electrically conductive material and is coupled directly to the core portion 170. In an embodiment, the core portion 170 and the base portion 180 both include a metal material. The base portion 180 has a lateral dimension 195 that is greater than the lateral dimension 110 of the opening 100 (shown in FIG. 2). Thus, the LED device 140 and the base portion 180 may have different sizes, or non-equivalent areas. And since the core portion 170 and the base portion 180 have different areas, the carrier 150 may be referred to as a non-equivalent area carrier. Although not illustrated, it is understood that other core portions similar to the core portion 170 may be coupled to the base portion 180 as well.

The contact pad 160 is formed on the LED device 160 and may be considered as a part of the LED device 160. The contact pad 160 includes a metal material and serves as a contact electrode (for example, as an N-contact electrode) for the LED device 140. The base portion 180 of the carrier 150 may serve as the opposite contact electrode (for example, as a P-contact electrode) for the LED device 140.

FIGS. 3B and 3C respectively illustrate portions of LED-containing structures 200 and 210 that are similar to the LED-containing structure 130 of FIG. 3A. For purposes of consistency and clarity, similar components are labeled the same throughout FIGS. 3A-3C. However, the LED-containing structures 130, 200, and 210 have carriers that include different base portions.

Referring to FIG. 3B, the LED-containing structure 200 has a base portion 220 that includes a heavily doped silicon material. Thus, the base portion 220 is different from the base portion 180 (of the LED-containing structure 130), since the base portion 180 includes metal. Metal pads 225 and 226 are formed on the heavily doped silicon material of the base portion 220. The metal pads 225-226 may also be viewed as a part of the base portion 220.

Referring to FIG. 3C, the LED-containing structure 210 has a base portion 230 that is different from the base portions 180 and 220. The base portion 230 includes a silicon layer 231 that is disposed between two dielectric layers 232-233, which are further disposed between two metal layers 234-235. The metal layer 234 is directly coupled to the core portion 170 of the carrier 150. The dielectric layers 232-233 may include an oxide material, a nitride material, or an oxy-nitride material. These dielectric materials of the dielectric layers 232-233 have relatively good thermal conductivity, but they are electrically insulating. Hence, thermal energy may be dissipated through the dielectric layers 232-233, but electrical signals cannot travel through the dielectric layers 232-233. As such, the base portion 230 allows for separate thermal dissipation and electrical conduction paths.

Figure 4:
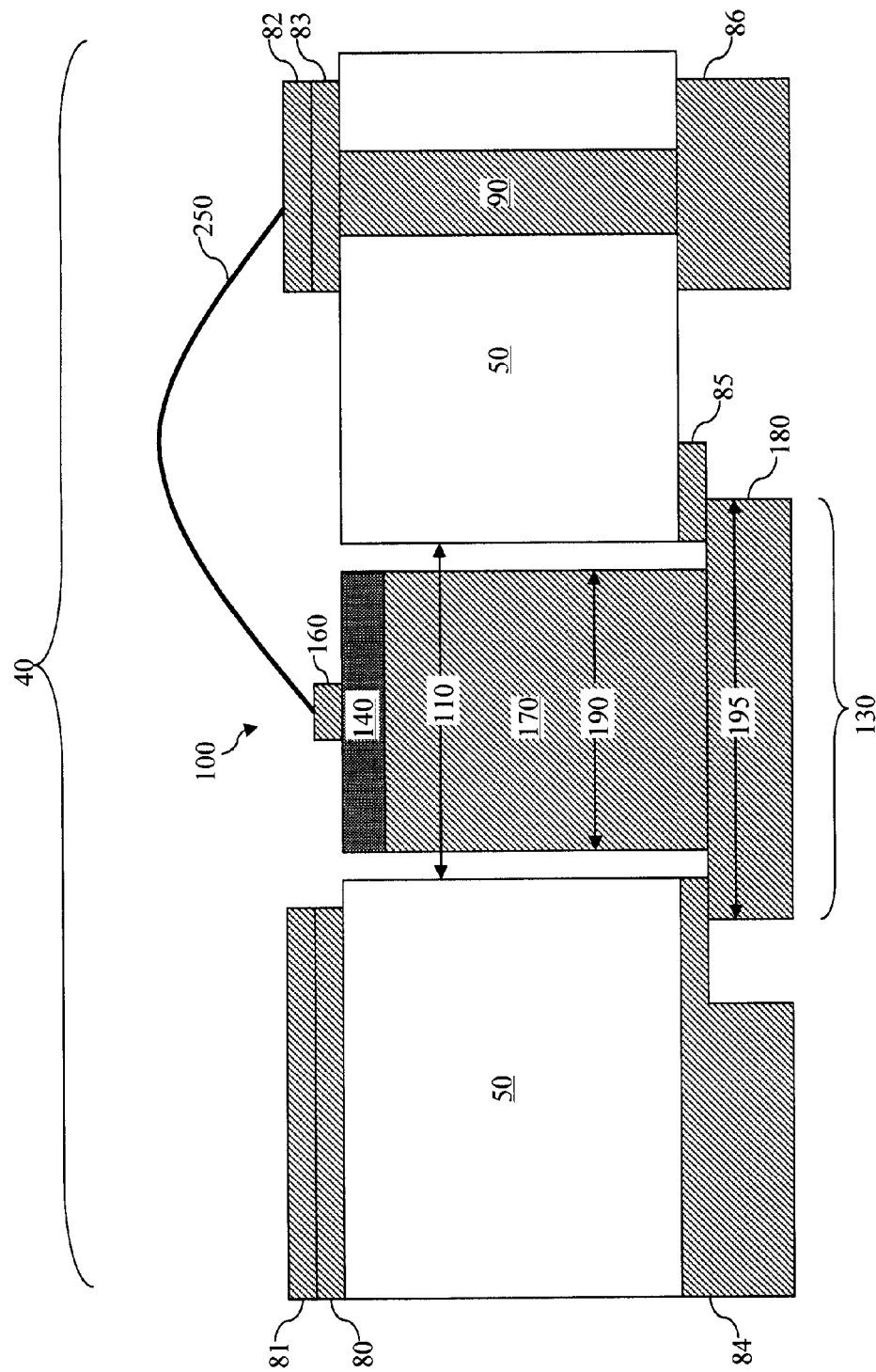
FIGS. 4-8 are diagrammatic fragmentary cross-sectional side views of different embodiments of the wafer of FIG. 2 and the structure that contains an LED device being inserted into the opening of the wafer in accordance with various aspects of the present disclosure.

Referring now to FIG. 4, the LED-containing structure 130 is coupled to the wafer 40. The LED device 140, along with the core portion 170 of the carrier 150, is inserted to the opening 100. It is understood that although FIG. 4 only shows the insertion of one of the LED devices 140 and one of the carriers 150, a plurality of other LED devices and other carriers may be inserted into other un-illustrated openings. As discussed above, the lateral dimension 190 of the core portion 170 (and of the LED device 140) is smaller than the lateral dimension 110 of the opening 100. Thus, the LED device 140 and the core portion 170 partially fill the opening 100, leaving gaps between the substrate 50 and the LED-containing structure 130 (specifically, the LED device 140 and the core portion 170).

Since the base portion 180 of the carrier 150 is wider than the opening 100 (having a greater lateral dimension), the base portion 180 is not inserted into the opening 100. Rather, the base portion 180 is coupled to the conductive elements 84 and 85. In one embodiment, the base portion 180 and the conductive elements 84-85 are coupled together using a bonding process, which involves application of both heat and pressure to the base portion 180 and the conductive elements 84-85. In another embodiment, the base portion 180 and the conductive elements 84-85 are coupled together using an electroplating process. In yet another embodiment, base portion and the conductive elements 84-85 are coupled together using a soldering process.

It is understood that the processes described above are performed at a wafer level. Alternatively stated, other LED-containing structures (not illustrated) are coupled to the wafer 40 at the same time the LED-containing structure 130 is coupled to the wafer 40. These other LED-containing structures are partially inserted into other openings similar to the opening 100 in the wafer 40.

The conductive element 82 and the contact pad 160 are then coupled together by a bonding wire 250 using a wire-bonding process. The bonding wire 250 may include a metal material such as copper, aluminum, gold, an alloy, or combinations thereof. The wire-bonding process is also performed at a wafer level. After the contact pad 160 has been bonded to the conductive element 82, an electrical voltage may be applied to the LED device 140 through the base portion 180 and the conductive element 86 (which is electrically coupled to the TSV 90 and the conductive elements 82-83).

Although not illustrated for the sake of simplicity, it is understood that the LED-containing structures 200 and 210 (FIG. 3) may also be coupled to the wafer 40 in a similar manner in alternative embodiments.

Figure 5:
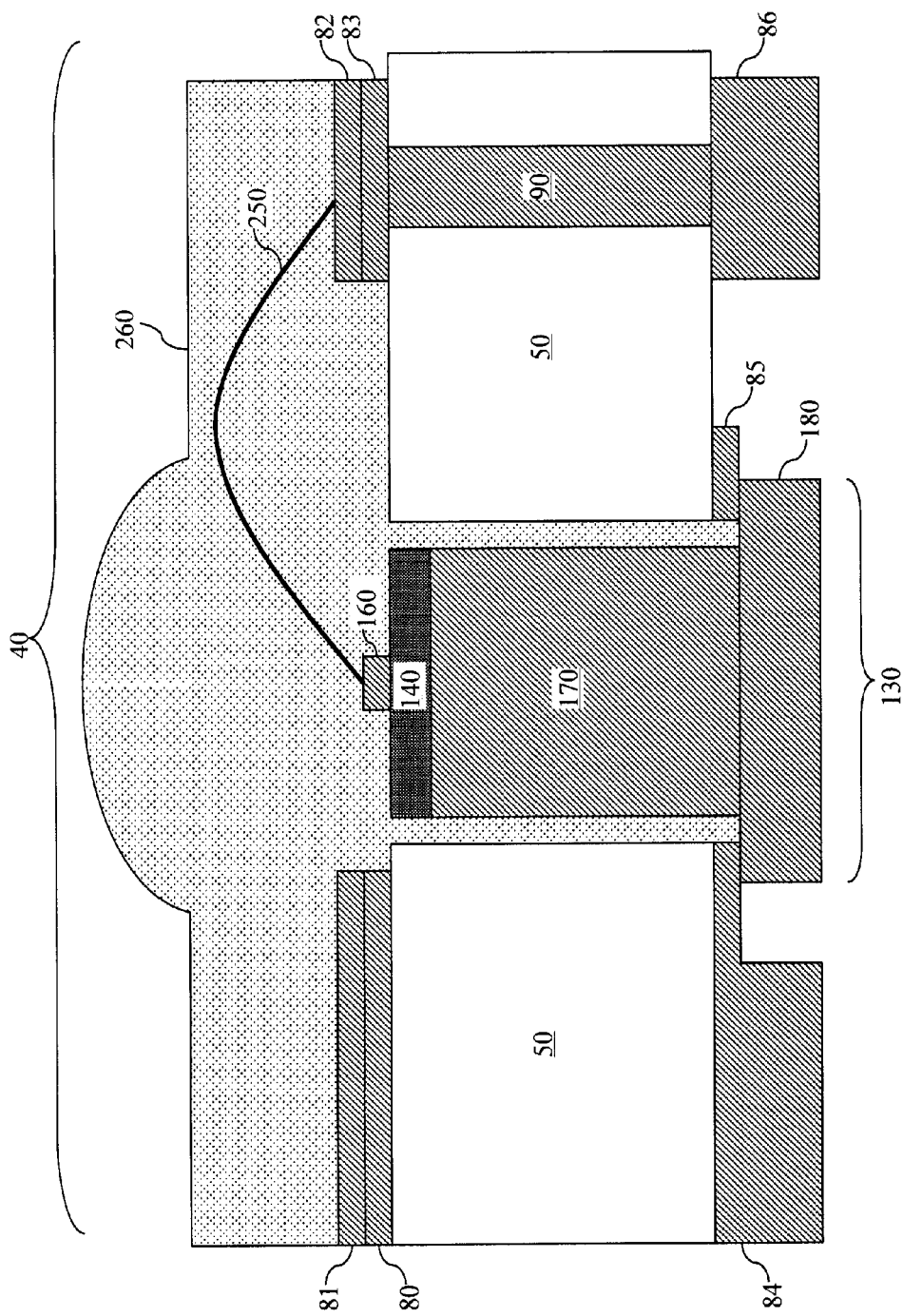

Referring now to FIG. 5, an isolation material 260 is formed over the wafer 40. The isolation material 260 may be electrically insulating. In an embodiment, the isolation material 260 includes a polymer material and is formed by an injection molding process known in the art. The isolation material 260 fills the gaps between the substrate 50 and the LED-containing structure 130 within the opening 100 (shown in FIG. 4). Therefore, the isolation material 260 electrically isolates the substrate 50 from the LED device 140 and the core portion 170. In addition, the isolation material 260 serves as a buffer for mechanical stress and strain. A top portion of the isolation material 260 may be shaped like a (curved) lens so that the light emitted by the LED device 140 may be directed and focused in an intended propagation direction.

The embodiment discussed above and illustrated in FIG. 5 offers advantages over existing LED devices. It is understood, however, that other embodiments may offer different advantages, and that no particular advantage is required for any embodiment. One of the advantages is efficient thermal dissipation. When the LED device 140 is in operation, it generates thermal energy such as heat. As can be seen from FIG. 5, the thermal energy can be efficiently dissipated "downwards" through the core portion 170 of the carrier 130, since the core portion includes a thermally conductive material. The thermal energy can further be dissipated "sideways" in an efficient manner through the base portion 180 and the conductive elements 84 and 85. In comparison, traditional LED devices may have to dissipate thermal energy generated by an LED device through a substrate having inefficient thermal dissipation characteristics. Thus, the embodiment shown in FIG. 5 offers improved thermal dissipation performance compared to existing LED devices.

Some existing LED devices also employ thermal dissipation pathways such as a plurality of metal vias or metal slugs. Forming these metal vias or slugs typically requires complex fabrication processes, which increase fabrication costs. Also, these complex fabrication processes may not be (or may not be compatible with) wafer level processes. In comparison, the embodiment illustrate in FIG. 5 employs simple and wafer level fabrication processes, thereby lowering fabrication costs and reducing fabrication complexity.

Further, in the embodiment where the base portion 230 (shown in FIG. 3C) is used as the base portion of the carrier 150, an additional advantage of separate thermal and electrical pathways is achieved. Specifically, many customers may prefer an LED device that allows for thermal energy to be dissipated in a path that is separate and different from an electrical signal path of the LED device. When the base portion 230 is used, the dielectric layers 232-233 (shown in FIG. 3C) prevent the electrical signals from propagating in the same path as the thermal dissipation path. Alternatively stated, the thermal energy can still be dissipated downwards through the dielectric layers 232-233, since the dielectric layers 232-233 may have relatively good thermal conductivity. But the electrical signals cannot propagate through the dielectric layers 232-233 and have to propagate sideways in the metal layer 234 (shown in FIG. 3C) instead.

Figure 6:
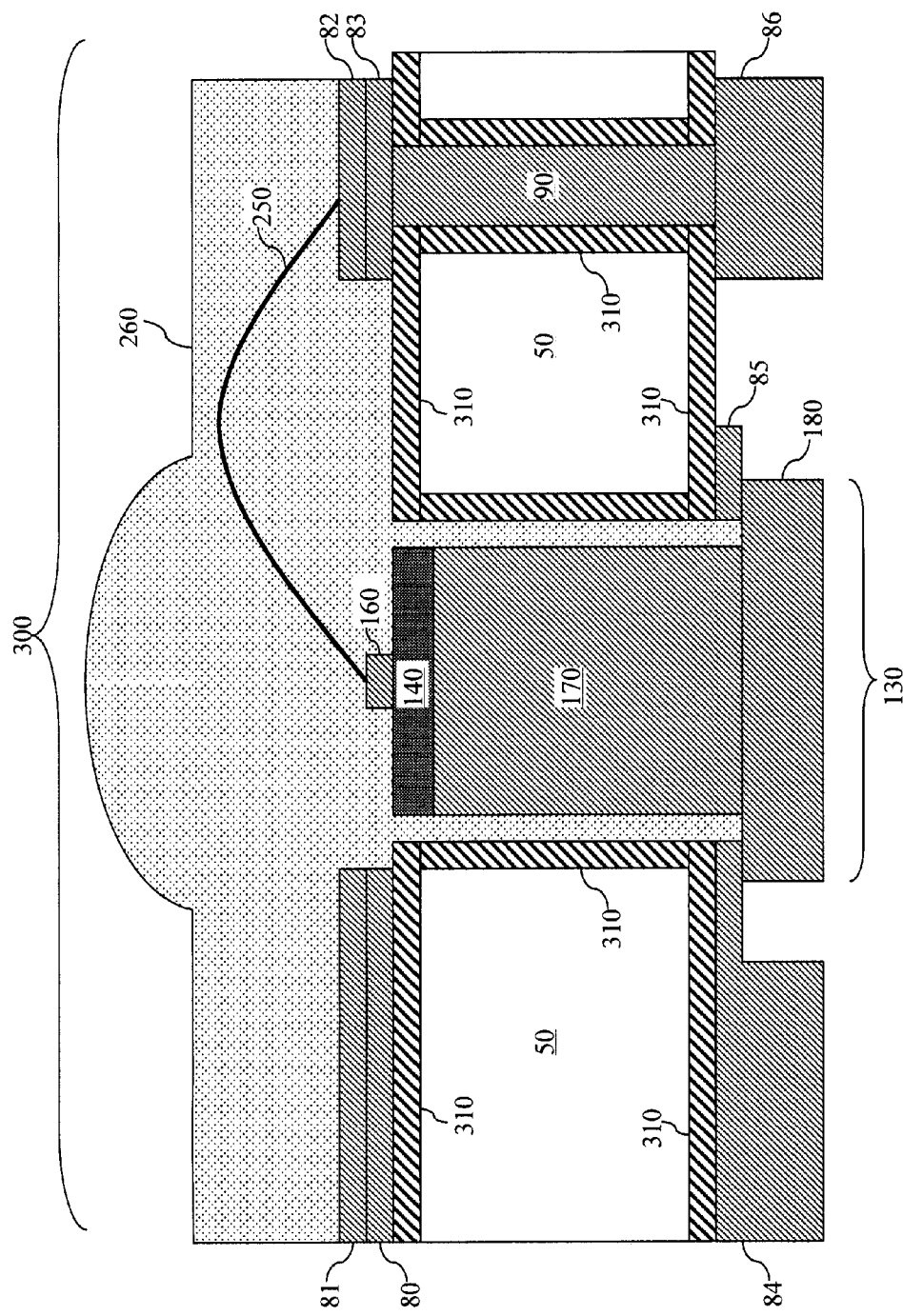
Figure 7:
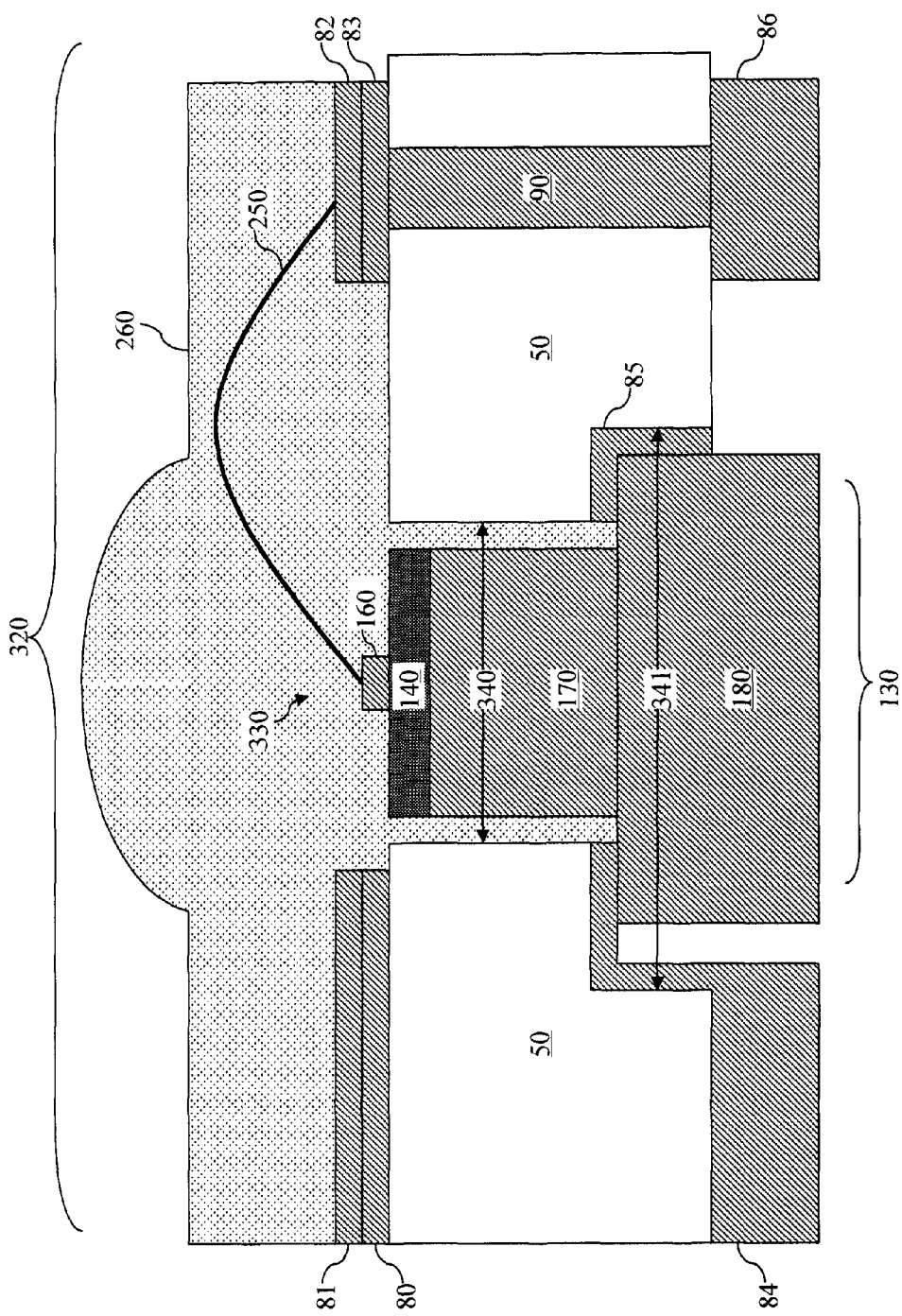
Figure 8:
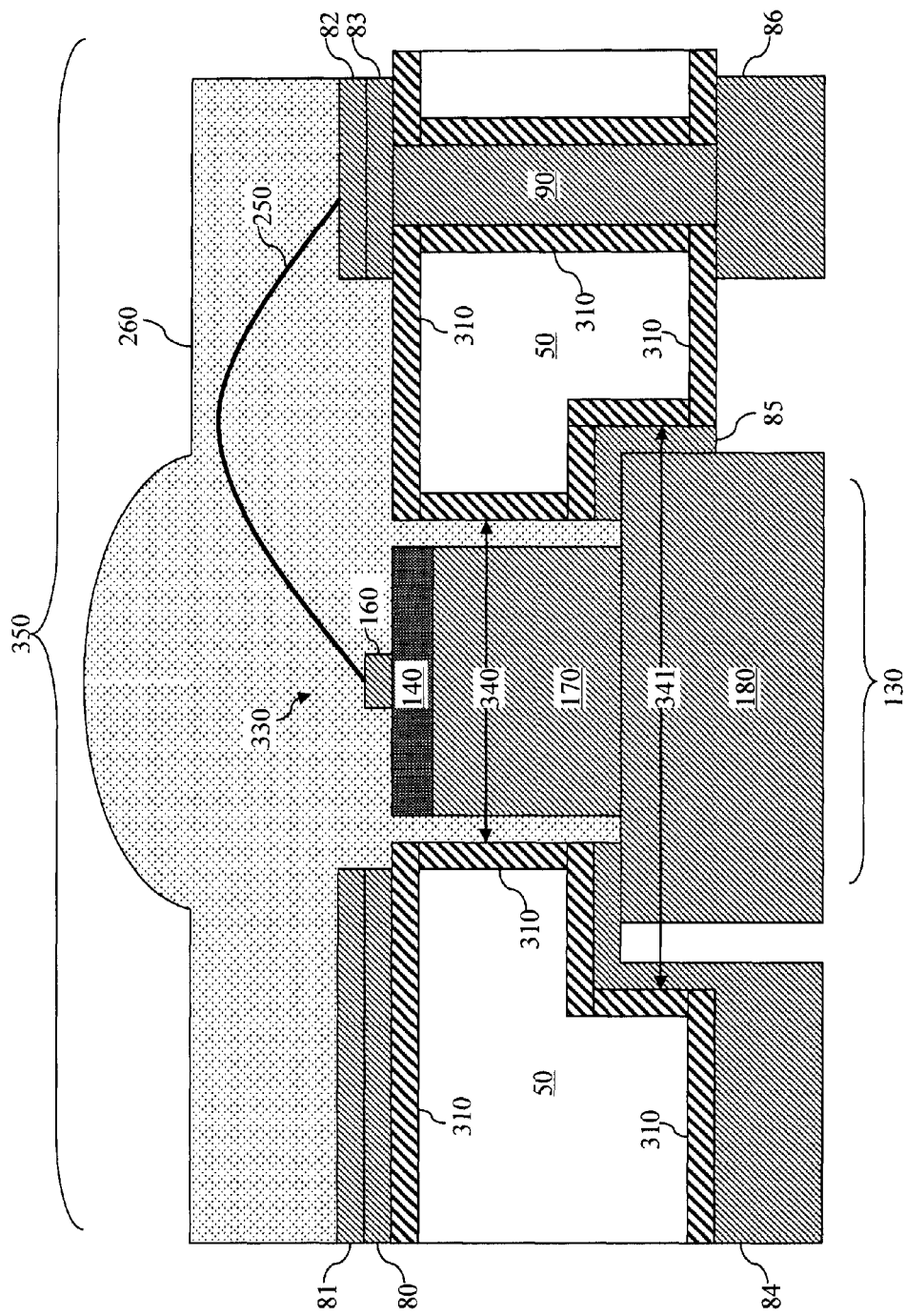

FIGS. 6-8 each illustrate an alternative embodiment of the present disclosure. The alternative embodiments involve using many elements that are the same or similar to the elements of the embodiment illustrated in FIG. 5. For purposes of consistency and clarity, these similar or same elements are labeled the same throughout FIGS. 5-8.

FIG. 6 illustrates a portion of a wafer 300 that is similar to the wafer 40 (shown in FIGS. 2-5). An LED-containing structure such as the LED-containing structure 130 is coupled to the wafer 300 in a manner similar to those discussed above in association with the LED-containing structure 130 and the wafer 40. For example, the LED device 140 and the core portion 170 therebelow are inserted into and partially fill the opening in the wafer 300. Therefore, the embodiment illustrated in FIG. 6 offers similar advantages (such as efficient thermal dissipation) as the embodiment illustrated in FIG. 5.

However, one difference between the wafers 40 and 300 is that the wafer 300 includes a dielectric material 310 that surrounds the various portions of the substrate 50. Therefore, the embodiment illustrated in FIG. 6 offers an additional advantage in that the dielectric material 310 helps reduce leakage, for example by preventing shorting between the N-side and the P-side of the LED device 140 through the substrate 50.

FIG. 7 illustrates a portion of a wafer 320 similar to the wafer 40 (shown in FIGS. 2-5). An LED-containing structure such as the LED-containing structure 130 is coupled to the wafer 320 in a manner similar to those discussed above in association with the LED-containing structure 130 and the wafer 40. For example, the LED device 140 and the core portion 170 therebelow are inserted into and partially fill the opening in the wafer 320. Therefore, the embodiment illustrated in FIG. 7 offers similar advantages (such as efficient thermal dissipation) as the embodiment illustrated in FIG. 5.

However, one difference between the wafers 40 and 320 is that for the wafer 40, the opening 100 (shown in FIG. 2) is formed to have a substantially uniform lateral dimension 110 throughout the entire cross section of the substrate 50. In comparison, for the wafer 320, an opening 330 is formed. The opening 330 does not have a constant and uniform lateral dimension throughout the substrate 50. Instead, the opening 330 has a narrower portion having a lateral dimension 340 and a wider portion having a lateral dimension 341. The narrower portion of the opening 330 is partially filled by the LED device 140 and the core portion 170 of the carrier. The wider portion of the opening 330 is partially filled by the base portion 180 of the carrier.

The shapes of the conductive elements 84 and 85 (to which the base portion 180 is coupled) are adjusted to correspond with the shape of the opening 330. The opening 330 may also be referred to a "spot-facing hole". Forming such spot-facing hole involves more operations in the fabrication processes but may allow for easier assembly. Thus, the embodiment shown in FIG. 5 and the embodiment shown in FIG. 7 may involve a tradeoff between simpler fabrication and easier assembly. It is understood, however, that both of these embodiments have efficient thermal dissipation.

FIG. 8 illustrates a portion of a wafer 350 that involves a combination of the wafers 300 (shown in FIG. 6) and 320 (shown in FIG. 7). In other words, the wafer 350 uses the dielectric material 310 to surround the substrate 50, and the wafer 350 also utilizes a spot-facing hole 330. Therefore, the embodiment illustrated in FIG. 8 offers advantages similar to those discussed above in association with the embodiments illustrated in FIGS. 6 and 7.

It is understood that additional fabrication processes may be performed to complete the fabrication of the LED devices. As discussed above, the present disclosure involves a wafer-level processing of LED packages. On a single LED wafer, many LED devices are installed in the respective through holes. The packaged wafer LED wafer is sliced or diced into a plurality of individual LED packages, LED emitters, or LED boards. In other words, many smaller LED devices can be obtained from a single packaged LED wafer. For the sake of simplicity, the dicing process is not illustrated herein.

One of the broader forms of the present disclosure involves a packaged wafer. The packaged wafer includes: a wafer having a plurality of through-holes therein; a plurality of light-emitting diode (LED) devices installed in the plurality of through-holes, respectively; and a plurality of non-equivalent area conductive carriers coupled to the plurality of LED devices; wherein the plurality of conductive carriers is coupled to the wafer in a manner so that the plurality of LED devices and respective portions of the plurality of conductive carriers at least partially fill each of the through-holes.

Another of the broader forms of the present disclosure involves a packaged semiconductor wafer. The packaged semiconductor wafer includes: a substrate having a plurality of through-holes therein; a plurality of conductive structures having respective core components and respective base components, the core components each being inserted into a respective one of the through-holes, the base components each being coupled to respective portions of the substrate around the through-holes; a plurality of light-emitting diode (LED) devices that are respectively located on the core components and inside the through-holes, the LED devices each being spaced apart from sidewalls of the respective through-hole; and an insulating material formed over the substrate, a portion of the insulating material filling a space between the LED devices and sidewalls of the respective through-hole.

Still another of the broader forms of the present disclosure involves a method of fabricating an LED device. The method includes: forming a plurality of openings in a wafer; coupling a plurality of light-emitting diode (LED) devices to a plurality of conductive carriers, respectively; and at least partially filling each of the plurality of openings with each of the plurality of the LED devices and a respective portion of each of the conductive carriers.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a device, the method comprising:
   providing a substrate having a first side and a second side opposite the first side;
   etching an opening in a substrate, the opening extending through the substrate from the first side to the second side;
   providing an light-emitting diode (LED)-containing structure, the LED-containing structure including a base portion, a conductive core portion disposed over the base portion, and an LED disposed over the core portion; and
   partially inserting the LED-containing structure into the opening in a manner such that the core portion is disposed within the opening while the base portion is disposed outside the opening.

2. The method of claim 1, wherein providing the substrate is performed such that a conductive pad is disposed on the first side of the substrate; and further comprising: wire bonding the LED to the conductive pad disposed on the first side of the substrate.

3. The method of claim 1, wherein:
   providing the substrate is performed such that a conductive pad is disposed on the second side of the substrate; and
   partially insert the LED-containing structure is performed such that the base portion is bonded to the conductive pad disposed on the second side of the substrate.

4. The method of claim 1, wherein providing the LED-containing structure is performed such that the base portion is wider than the opening and the core portion is narrower than the opening.

5. The method of claim 1, further comprising depositing an isolation material over the first side of the substrate.

6. The method of claim 1, wherein the opening divides the substrate into a first portion and a second portion, and further comprising: forming a dielectric material around each of the first and second portions of the substrate.

7. The method of claim 1, wherein providing the LED-containing structure is performed such that the base portion includes a metal component.

8. The method of claim 1, wherein providing the LED-containing structure is performed such that the base portion includes a heavily-doped silicon component and metal pads disposed on the silicon component.

9. The method of claim 1, wherein providing the LED-containing structure is performed such that the base portion includes a silicon layer, first and second dielectric layers, and first and second metal layers, wherein the silicon layer is disposed between the first and second dielectric layers, and wherein the first and second dielectric layers are disposed between the first and second metal layers.

10. A method for fabricating a device, the method comprising:
   providing a wafer having a first side and a second side opposite the first side, the wafer having a plurality of first metal pads disposed on the first side and a plurality of second metal pads disposed on the second side;
   etching a plurality of holes in the wafer, the holes each extending through the wafer from the first side to the second side;
   providing a plurality of light-emitting diode (LED)-containing structures, the LED-containing structures each including a base portion, a conductive core portion disposed over the base portion, and an LED disposed over the core portion;

placing the LED-containing structures into the plurality of holes in a manner such that the base portion for each LED-containing structure comes into contact with a different one of the second metal pads, respectively; and wire bonding the LED of each LED-containing structure to a different one of the first metal pads, respectively.

11. The method of claim 10, wherein the base portion for each LED-containing structure is wider than the core portion.

12. The method of claim 10, further comprising depositing a dielectric material over the first side of the wafer.

13. The method of claim 10, wherein providing the LED-containing structure is performed such that the base portion includes one of: a metal base portion, a silicon base portion having metal pads disposed thereon, and a composite structure containing a silicon layer disposed between two dielectric layers that are disposed between two metal layers.

14. A method for fabricating a device, the method comprising:

forming a plurality of openings in a wafer;

coupling a plurality of light-emitting diode (LED) devices to a plurality of conductive carriers, respectively; and at least partially filling each of the plurality of openings with each of the plurality of the LED devices and a respective portion of each of the plurality of conductive carriers.

15. The method of claim 14, wherein:

forming the plurality of openings includes: dry etching the plurality of openings in a substrate, the substrate having one of: a silicon material, a ceramic material, a plastic material, and an organic material, the substrate having a plurality of first and second conductive elements disposed on opposite sides of the substrate;

coupling the plurality of LED devices includes: coupling each of the LED devices to a core portion of each of the conductive carriers, the core portion being the portion of each of the conductive carriers that partially fills each of the openings; and at least partially filling each of the plurality of openings includes: coupling a base portion of each of the conductive carriers to one of the respective first and second conductive elements.

16. The method of claim 15, wherein:

the openings each have a first lateral dimension;

the core portion has a second lateral dimension that is smaller than the first lateral dimension; and the base portion has a third lateral dimension that is greater than the first lateral dimension.

17. The method of claim 15, wherein the base portion includes a structure that is selected from the group consisting of: a metal layer, a heavily doped silicon layer, and a silicon layer being disposed between two dielectric layers, the two dielectric layers being disposed between two metal layers.

18. The method of claim 15, wherein forming the plurality of openings is carried out in a manner so that:

the openings each have a first portion in one part of the substrate and a second portion in a different part of the substrate, the first portion of the opening being narrower than the second portion of the opening; and wherein at least partially filling each of the plurality of openings includes:

placing each of the LED devices and the core portion of each of the conductive carriers partially inside the first portion of a respective one of the openings; and placing the base portion of each of the conductive carriers partially inside the second portion of a respective one of the openings.

19. The method of claim 15, further including: forming a dielectric material to surround portions of the substrate, the dielectric material being formed between the first and second conductive elements.

20. The method of claim 14, wherein at least partially filling each of the plurality of openings includes: wire-bonding each of the LED devices with a respective through-silicon-via (TSV) that extends through the substrate; and further including:

filling gaps between each of the LED devices and the wafer with a isolation material;

forming a plurality of lenses for the LED devices by shaping portions of the isolation material; and dicing the wafer to obtain a plurality of LED emitter devices.

* * * * *